United States Patent
Jang et al.

(10) Patent No.: US 12,310,268 B2
(45) Date of Patent: May 20, 2025

(54) NEUROMORPHIC MEMRISTOR DEVICE BASED ON VERTICALLY-ORIENTED HALIDE PEROVSKITE NANOSTRUCTURE AND METHOD OF MANUFACTURING THE SAME

(71) Applicant: Seoul National University R&DB Foundation, Seoul (KR)

(72) Inventors: Ho Won Jang, Seoul (KR); Seung Ju Kim, Seoul (KR)

(73) Assignee: Seoul National Unviersity R&DBFoundation, Seoul (KR)

( * ) Notice: Subject to any disclaimer, the term of this patent is extended or adjusted under 35 U.S.C. 154(b) by 492 days.

(21) Appl. No.: 17/537,071

(22) Filed: Nov. 29, 2021

(65) Prior Publication Data
US 2023/0172082 A1 Jun. 1, 2023

(51) Int. Cl.
*H10N 70/00* (2023.01)
*H10N 70/20* (2023.01)

(52) U.S. Cl.
CPC ......... *H10N 70/881* (2023.02); *H10N 70/041* (2023.02); *H10N 70/021* (2023.02); *H10N 70/24* (2023.02); *H10N 70/826* (2023.02)

(58) Field of Classification Search
CPC ...................................................... H10N 70/00
See application file for complete search history.

(56) References Cited

U.S. PATENT DOCUMENTS

| 10,770,239 B1* | 9/2020 | Mohite | H10K 85/141 |
| 2020/0194669 A1* | 6/2020 | Jang | H10N 70/841 |

FOREIGN PATENT DOCUMENTS

| KR | 10-2017-0113453 | 10/2017 |
| KR | 10-2020-0073081 | 6/2020 |

OTHER PUBLICATIONS

Cheng et al., "Pseudohalide-Induced 2D $(CH_3NH_3)_2PbI_2(SCN)_2$ Perovskite for Ternary Resistive Memory with High Performance", Nano Micro Small, Feb. 2018, Small 2018, vol. 14, Issue 12, 1703667, Wiley-VCH Veralg GmbH & Co. KGaA, Weinheim.

* cited by examiner

Primary Examiner — Marvin Payen

(57) ABSTRACT

The present invention provides a neuromorphic memristor device, which includes a resistive switching layer formed on a lower electrode; and an upper electrode formed on the resistive switching layer, in which the resistive switching layer includes an organic metal halide having a perovskite crystal structure.

9 Claims, 11 Drawing Sheets

(a)

(b)

Ruddlesden-Popper Perovskites : $(R-NH_3)_2A_{n-1}B_nX_{3n+1}$

Dion-Jacobson Perovskites : $(NH_3-R-NH_3)A_{n-1}B_nX_{3n+1}$

NEUROMORPHIC MEMRISTOR DEVICE BASED ON VERTICALLY-ORIENTED HALIDE PEROVSKITE NANOSTRUCTURE AND METHOD OF MANUFACTURING THE SAME

DESCRIPTION OF GOVERNMENT-FUNDED RESEARCH AND DEVELOPMENT

The present disclosure is made with the support of the Ministry of Science and ICT, Republic of Korea, under Project Identification No. 1711128666 and Project No. 2016M3D1A1027666, which was conducted in the task named "Development of molecular mobility ion crystal material for ultra-low voltage mV driven memristor" in the research project named "Discovery of Future Material", by Seoul National University, under the research management of the National Research Foundation of Korea, from May 1, 2016 to Jun. 30, 2022.

CROSS-REFERENCE TO RELATED APPLICATION

This application claims priority of Korean Patent Application No. 10-2021-0165497, filed on Nov. 26, 2021, in the KIPO (Korean Intellectual Property Office), the disclosure of which is incorporated herein entirely by reference.

BACKGROUND OF THE INVENTION

Field of the Invention

The present invention relates to a neuromorphic memristor device based on a vertically-oriented halide perovskite nanostructure and a method of manufacturing the same.

Description of the Related Art

With the rapid development of semiconductor technology, computing technology has developed consistently, but the scaling of a CMOS semiconductor-based process is reaching a technological limit, and in computing with the existing von Neumann structure, the bottleneck phenomenon between a computing device and a storage device inevitably occurs. A new computing concept is needed to overcome the problems of slowing down and increasing power consumption caused thereby. Based on this demand, research on devices and systems which overcome the limitations of device integration and power consumption by mimicking the human brain neural network is being conducted, and is called neuromorphic technology.

Recently, starting with machine learning technology in software, deep learning algorithm research is leading the dramatic development of neuromorphic software. However, for such a software-based neuromorphic system, it is necessary for a novel method of hardware development, which is suitable for processing an enormous amount of matrix operations that did not previously exist.

A neuromorphic memristor device is a device which is implemented by mimicking the information processing method of neurons and synapses of human brain nerves in electronic devices, and can improve integration, rapidly process a large amount of complex data in a mode of implementing a multi-level state in one device, not a digital mode with a smaller scale, and have the ability to learn and reason about data changes, compared to a conventional CMOS transistor structure. To implement the device, conventional phase change application technology, ferroelectric phenomenon application technology and spin-transfer torque magnetic technology are suggested, but among these, the most noteworthy technology is resistive switching technology.

A resistive switching device is a device in which a filament through which current can flow due to a voltage applied between electrodes is formed to make a resistance state gradually changed. While transition metal compounds, inorganic perovskites, chalcogenides, and organic materials have been studied and reported so far, they have limitations such as high-power consumption, complex element composition, high process temperature, and hard materials. Recently reported extra-low voltage-driven resistive switching of organic/inorganic halide perovskites is attracting attention as disclosed in Korean Unexamined Patent Application Publication No. 10-2017-0113453, published on Oct. 12, 2017.

However, until now, research has been focused on materials that can form halide perovskite films or control of dimensionality. A high-performance neuromorphic memristor device has to implement step-by-step and gradual resistive switching, and to this end, it is essential to understand and develop filament control technology on a film.

SUMMARY OF THE INVENTION

The present invention is directed to providing a neuromorphic memristor device based on a vertically-oriented halide perovskite nanostructure.

However, technical problems to be solved in the present invention are not limited to the above-described problems, and other problems which are not described herein will be fully understood by those of ordinary skill in the art from the following descriptions.

As a technical means for achieving the above-described technical problems, one aspect of the present invention provides a neuromorphic memristor device, which includes a resistive switching layer formed on a lower electrode; and an upper electrode formed on the resistive switching layer, in which the resistive switching layer includes an organic metal halide having a perovskite crystal structure.

According to one embodiment of the present invention, the resistive switching layer has a vertically-oriented nanostructure.

According to one embodiment of the present invention, the organic metal halide is represented by Formula 1 below.

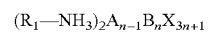 [Formula 1]

wherein, A is any one selected from the group consisting of Rb, Cs, K, Mg, Ca, Sr, Ba and an organic cation, B has one or more metal cations selected from the group consisting of Cr, Mn, Fe, Co, Ni, Cu, Zn, Ga, In, Tl, Ge, Cd, Hf, Sn, Bi, and Pb, $R_1$ is a substituted or unsubstituted $C_{1-24}$ alkyl group or a substituted or unsubstituted $C_{1-24}$ aryl group, X includes a halide anion or chalcogenide anion, and n is an integer of 2 or more.

According to one embodiment of the present invention, a size of the $R_1$—$NH_3$ is larger than that of $R_2$—$NH_3$ or an alkali metal cation, which is included in A.

According to one embodiment of the present invention, the $R_1$—$NH_3$ is one or more selected from the group consisting of butylamine, phenethylamine and hexenylamine.

According to one embodiment of the present invention, the alkali metal cation is one or more alkali metal cations selected from the group consisting of Rb, Cs, K, Mg, Ca, Sr, and Ba.

According to one embodiment of the present invention, the X is one or more types of elements selected from the group consisting of F, Cl, Br, I, S and Se.

The second aspect of the present invention provides a method of manufacturing a neuromorphic memristor device, which includes: forming a resistive switching layer on a lower electrode; and forming an upper electrode on the resistive switching layer, in which the resistive switching layer is formed by coating with a solution containing an organic metal halide.

According to one embodiment of the present invention, the solution may include an anionic additive.

According to one embodiment of the present invention, the anionic additive may include a pseudohalide anion.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
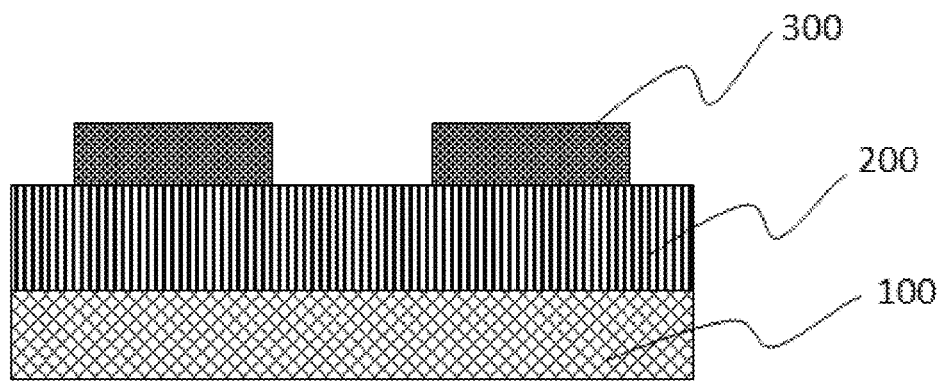
FIG. 1 shows the structure of a neuromorphic memristor device of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

The present invention provides a neuromorphic memristor device, which includes a resistive switching layer formed on a lower electrode; and an upper electrode formed on the resistive switching layer, in which the resistive switching layer includes an organic metal halide having a perovskite crystal structure, and the cross-section of the device of the present invention is schematically shown in FIG. 1.

Figure 2:
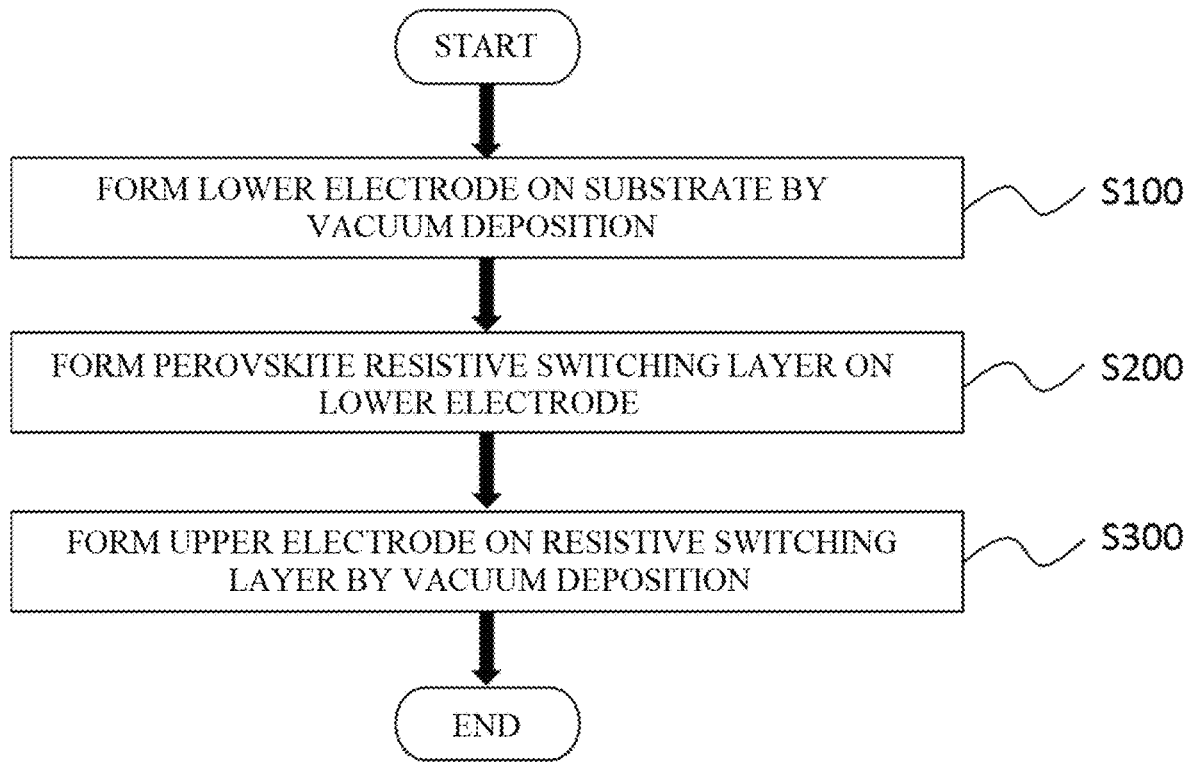
FIG. 2 is a diagram illustrating a method of manufacturing a neuromorphic memristor device.
Figure 3:
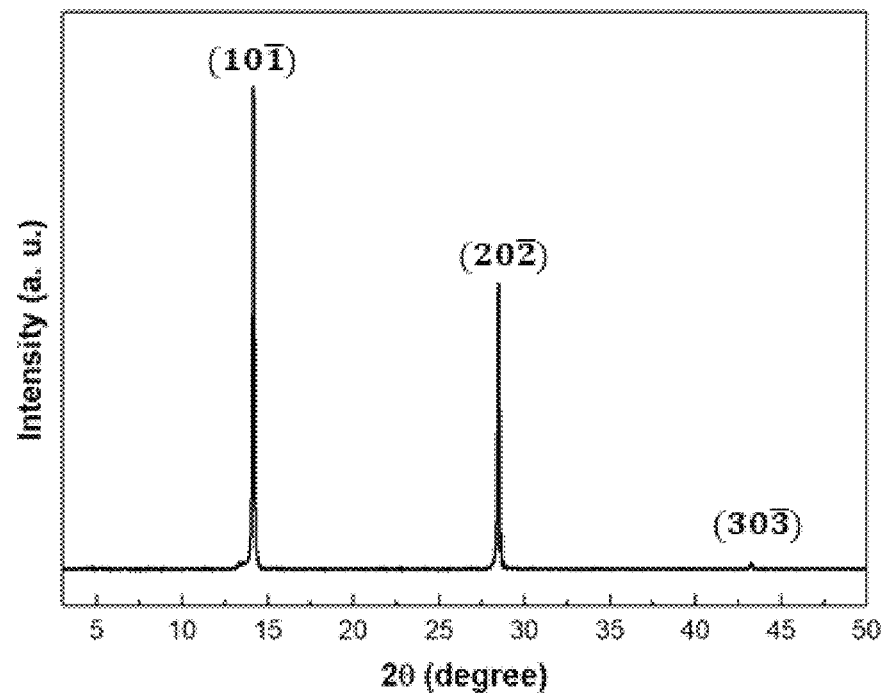
FIG. 3 shows an X-ray diffraction analysis result for phase analysis of a halide perovskite film having a vertically-oriented nanostructure, synthesized in an example of the present invention.

In addition, the present invention provides a method of manufacturing a neuromorphic memristor device, which includes forming a resistive switching layer on a lower electrode; and forming an upper electrode on the resistive switching layer, in which the resistive switching layer is formed by coating with a solution containing an organic metal halide. The manufacturing method is shown in FIG. 2.

The resistive switching layer of the present invention has a vertically-oriented nanostructure. More specifically, in the present invention, a resistive switching layer including an organic metal halide represented by Formula 1 below is used to have a vertically-oriented nanostructure.

$$(R_1-NH_3)_2A_{n-1}B_nX_{3n+1}$$ [Formula 1]

wherein, A is any one selected from the group consisting of Rb, Cs, K, Mg, Ca, Sr, Ba and an organic cation, B has one or more metal cations selected from the group consisting of Cr, Mn, Fe, Co, Ni, Cu, Zn, Ga, In, Tl, Ge, Cd, Hf, Sn, Bi, and Pb, $R_1$ is a substituted or unsubstituted $C_{1-24}$ alkyl group or a substituted or unsubstituted $C_{1-24}$ aryl group, X includes a halide anion or chalcogenide anion, and n is an integer of 2 or more.

In one embodiment of the present invention, $(R_1-NH_3)$ in Formula 1 of the present invention may include an organic material having a larger particle size than a material in the A site, in which $R_1$ may be a butyl group, a phenylethyl group or a hexenyl group. Thus, the $(R_1-NH_3)$ includes a material relatively larger than an alkali metal cation such as A, or $R_2-NH_3$. For example, when $R_2-NH_3$ is methylamine, butylamine, phenylethylamine or hexenylamine is put into the $R_1-NH_3$, making $R_1-NH_3$ have a quasi-2D structure. Therefore, due to the quasi-2D structure, the device of the present invention can be used as a device with high physical and chemical stability and fast electron migration.

In another embodiment of the present invention, the alkali metal cation may be a cation of one or more alkali metals selected from the group consisting of Rb, Cs, K, Mg, Ca, Sr and Ba, but the present invention is not limited thereto.

In still another embodiment of the present invention, at the B site, a cation of one metal selected from the group consisting of Cr, Mn, Fe, Co, Ni, Cu, Zn, Ga, In, Tl, Ge, Cd, Hf, Sn, Bi and Pb is included, and at the X site, a halide anion or a chalcogenide anion is included. In the present invention, a halide perovskite thin film is manufactured by coating with a solution containing the above-described materials.

The X may be an anion of a halide such as F, Cl, Br or I, or an anion of a chalcogenide such as S or Se, but the present invention is not limited thereto.

A halide perovskite thin film layer having a vertically-oriented nanostructure may be synthesized by adding an additive having an anion with a similar size to a halide ion included in the X site to the solution.

The anionic additive includes a pseudohalide anion. The anionic additive may include a cyanide, isocyanide, cyanate or thiocyanate anion, and particularly, ammonium thiocyanate ($NH_4SCN$) or lead thiocyanate ($Pb(SCN)_2$), but the present invention is not limited thereto.

The n may be an integer of 2 or more, for example, an integer of 2 to 30, and preferably, an integer of 3 to 10, but the present invention is not limited thereto.

In the present invention, a resistive switching layer is formed by coating an upper part of the lower electrode with the organic metal halide solution. The coating method may be one of various deposition methods, for example, spin coating, dip coating, drop casting, electrodeposition, screen printing, bar printing, roll-to-roll, roll-to-plate, ink-jet printing, and micro-contact printing.

In the present invention, the lower electrode is manufactured by depositing an electrode such as indium-tin oxide (ITO) or fluorine-doped tin oxide (FTO) on a substrate such as glass. There are no limitations on materials used for the substrate and the electrode, and deposition of the electrode can be performed by various methods such as sputtering, pulsed laser deposition (PLD), thermal evaporation, molecular beam epitaxy (MBE), and chemical vapor deposition (CVD).

Meanwhile, a polar organic solvent may be one selected from the group consisting of N,N-diemthylformamide (DMF), dimethyl sulfoxide (DMSO), dimethylacetamide, N-methyl-2-pyrroidone (NMP), γ-butyrolactone and a mixture thereof.

In addition, thermal treatment is preferably performed at 40 to 250° C. When the thermal treatment is performed at less than 40° C., due to the low temperature, the grain size of the thin film layer with a perovskite structure does not increase, and thus the effect of thermal treatment cannot be expected, and when the thermal treatment is performed at more than 250° C., the thin film layer with a perovskite structure is decomposed.

In the present invention, the upper electrode may deposit a metal such as Au, Al, Cu, Ni, Fe, Cr, Ti, Zn, Pb or Ag onto the resistive switching layer, and the deposition can be performed by various methods such as sputtering, pulsed laser deposition (PLD), thermal evaporation, molecular beam epitaxy (MBE), and chemical vapor deposition (CVD).

The resistive switching layer of the present invention is formed by coating with a solution containing an organic metal halide, and since a channel making a filament when the organic metal halide of Formula 1 is formed in a vertically-oriented nanostructure is formed in advance, there are advantages of easier control of the filament and easier formation of the channel than a conventional random polycrystalline thin film. In addition, as the phase stability of the halide perovskite thin film is increased, the thin film is not decomposed in a humid atmosphere but maintained, so it is possible to effectively improve humidity stability and durability.

Hereinafter, the present invention will be described so that those of ordinary skill in the art will easily implement exemplary embodiments of the present invention with reference to the accompanying drawings. In addition, in the description of the present invention, detailed description of the related art will be omitted if it is determined that the gist of the present invention can be obscured. Moreover, certain features present in the drawings are enlarged, reduced or simplified for convenience of description, and the drawings and components thereof are not necessarily drawn to scale. However, the details will be easily understood by those of ordinary skill in the art.

Example 1

Manufacturing of Halide Perovskite Resistive Switching Device Having Vertically-Oriented Nanostructure A lower electrode in which ITO was deposited on glass was prepared. A $PEA_2MA_{n-1}Pb_nI_{3n+1}$ precursor solution (n is an integer of 2 or more, for example, an integer of 2 to 30, and preferably, an integer of 3 to 10, but the present invention is not limited thereto) was prepared by dissolving PEAI powder, MAI powder and $PbI_2$ powder in a DMAc, DMF or DMSO solvent, and to create vertical orientation, an anionic additive, that is, pseudohalide powder, was added. The precursor solution was applied to the lower electrode by spin coating, and thermally treated at 40 to 250° C., thereby forming a resistive switching layer.

Comparative Example 1

Manufacturing of Random Polycrystalline Halide Perovskite Resistive Switching Device A lower electrode in which ITO was deposited on glass was prepared. A $PEA_2MA_{n-1}Pb_nI_{3n+1}$ precursor solution was prepared by dissolving phenethylamine iodide (PEAI) powder, methylamine iodide (MAI) powder and $PbI_2$ powder in a DMAc, DMF or DMSO solvent, and without adding a separate anionic additive, the lower electrode was immediately spin-coated with the precursor solution and thermally treated at 40 to 250° C., thereby forming a resistive switching layer.

The resistive switching layer was formed by spin-coating the surface of the lower electrode with the above-described solution. After the resistive switching layer was formed, an Au upper electrode was deposited under vacuum, thereby manufacturing a neuromorphic memristor device.

Experimental Example 1

Result of Phase Analysis of Halide Perovskite Film Having Vertically-Oriented Nanostructure In the experimental example, an X-ray diffraction (XRD) graph of a neuromorphic device shows a result measured with D8-Advance (Bruker). The surface of a thin film and the cross-section of a device were observed using SEM, and the imaging device was MERLIN Compact (FE-SEM). In addition, to confirm a resistive switching characteristic, a current-voltage graph was plotted with resistive switching data measured using MS-Tech Probe Station.

Figure 4:
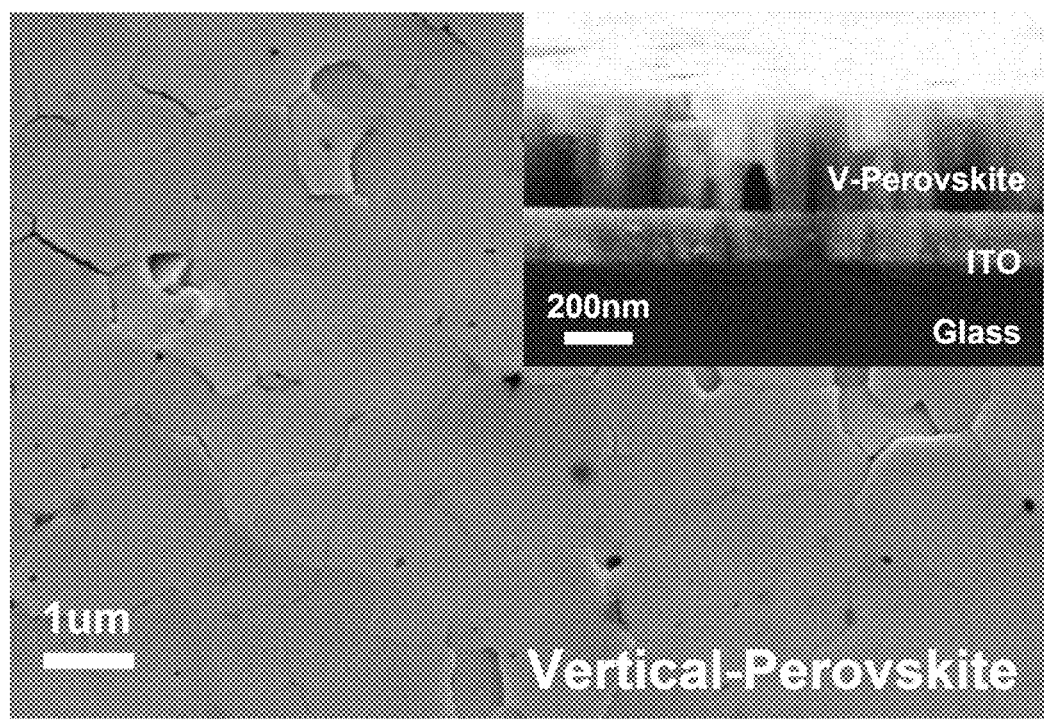
FIG. 4 shows the scanning electron microscope (SEM) analysis result for the cross-section and surface of a halide perovskite film having a vertically-oriented nanostructure according to the present invention.
Figure 5:
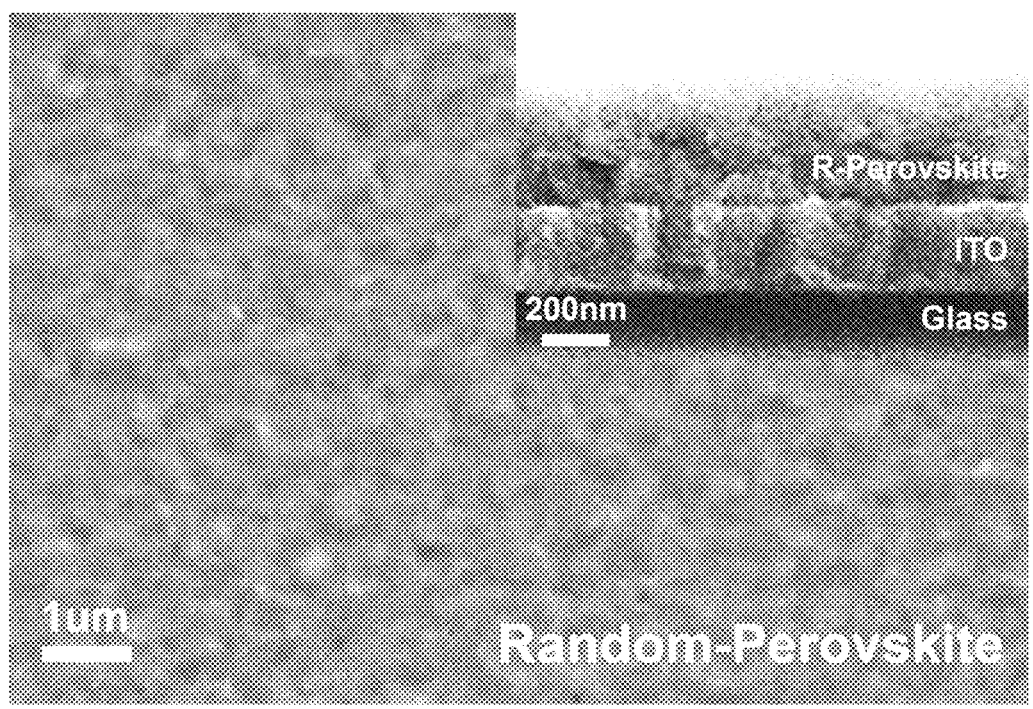
FIG. 5 shows the SEM analysis result for the cross-section and surface of a random polycrystalline halide perovskite.

The result of confirming the cross-section and surface of the resistive switching layer having a halide perovskite nanostructure, manufactured in Example 1, is shown in FIG. 4. In addition, the result of analyzing the cross-section and surface of the resistive switching layer manufactured in Comparative Example 1 using SEM is shown in FIG. 5. As a result, it was confirmed that the resistive switching layer of Example 1 was formed as a thin film with a smaller thickness than that of Comparative Example 1, and had a stable phase.

Figure 6:
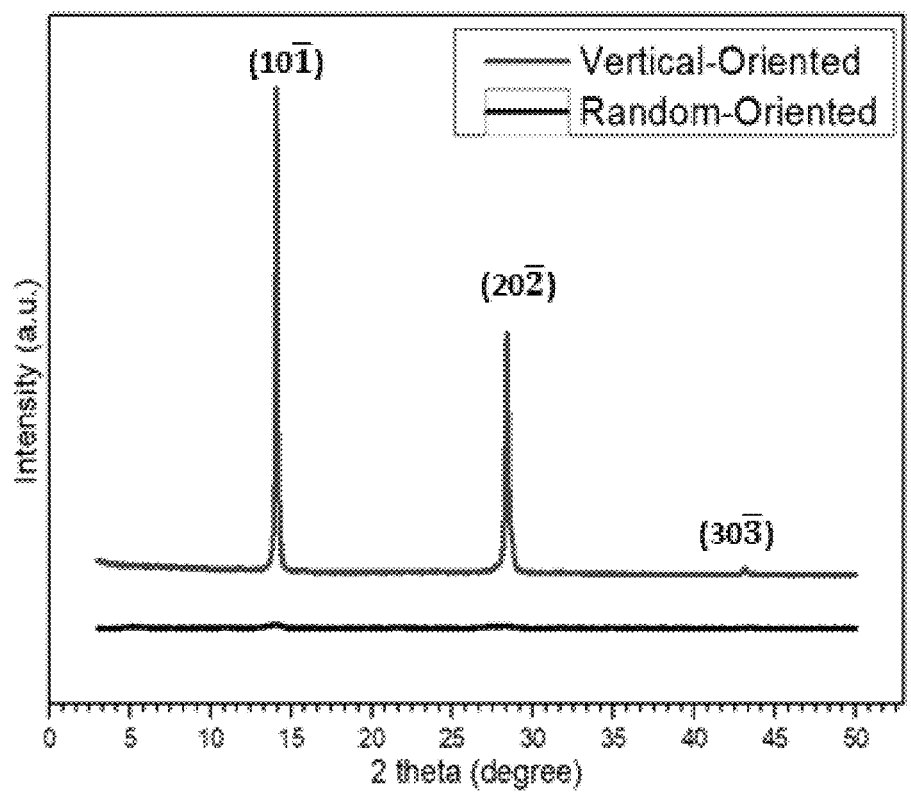
FIG. 6 shows the comparison of the X-ray diffraction analysis results between a halide perovskite film having a vertically-oriented nanostructure and a random polycrystalline halide perovskite film.

In addition, in FIG. 6, the result of X-ray diffraction analysis performed on the resistive switching layers manufactured in Example 1 and Comparative Example 1 is shown. In FIG. 6, in the case of "vertical-oriented," family peaks indicating growth in a vertical direction were clearly shown near $(1,0,-1)=14$ degrees, $(2,0,-2)=28$ degrees and $(3.0,-3)=43$ degrees, and had high intensity, indicating that a thin film in which crystals are uniformly grown was synthesized. On the other hand, in the case of "random-oriented," it can be seen that a polycrystalline structure, rather than an amorphous structure, showing peaks with very low intensity near 14, 28 and 43 degrees was formed. Accordingly, it can be demonstrated that the thin film was synthesized by controlling crystallinity.

Experimental Example 2

Figure 7:
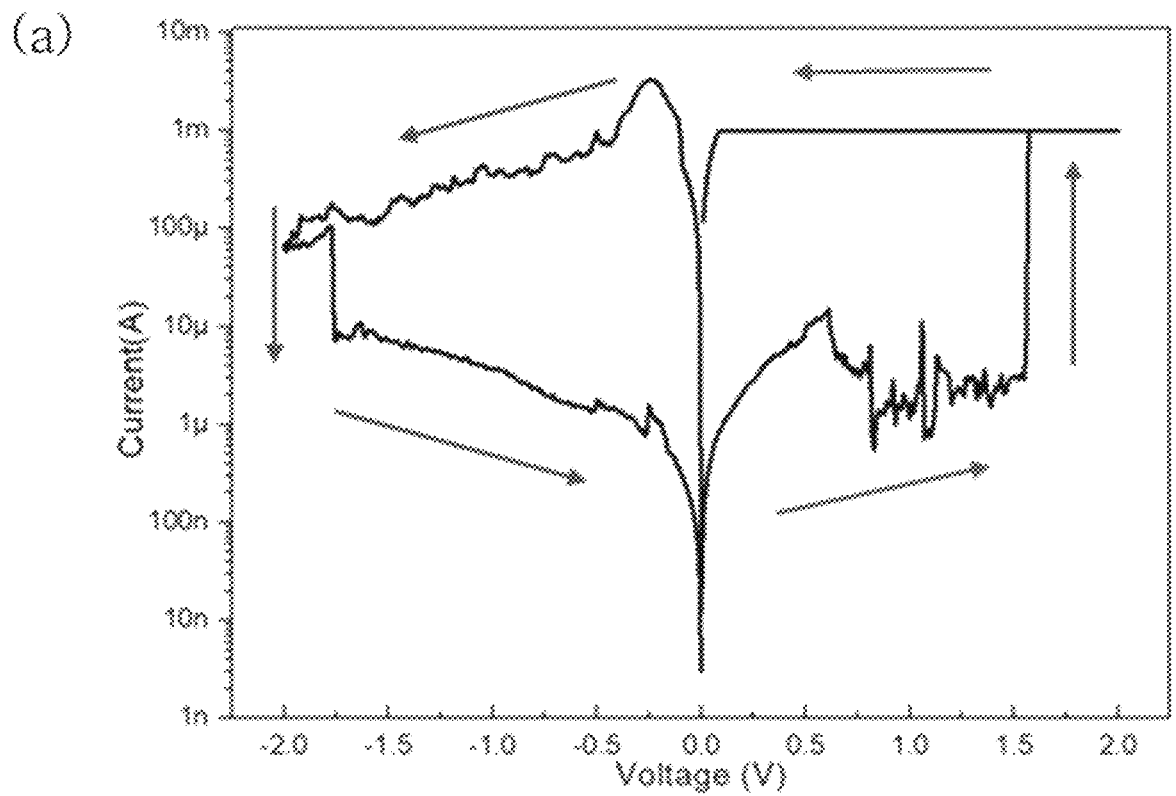
FIG. 7 is a current-voltage graph and an endurance measurement result for a memristor device using an Au upper electrode.
Figure 7:
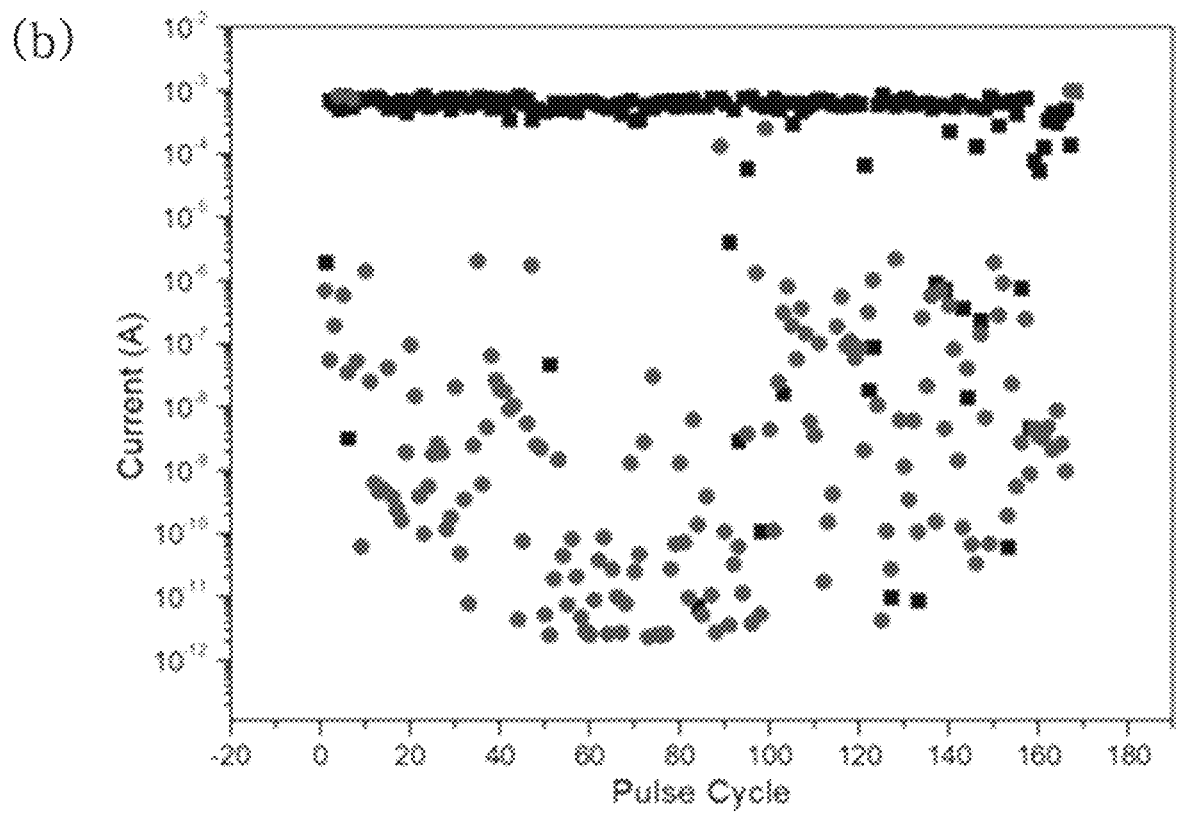

Identification of Resistive Switching Characteristic and Neuromorphic Characteristic of Halide Perovskite Material Having Vertically-Oriented Nanostructure In Experimental Example 2, the resistive switching characteristic and neuromorphic characteristic of the device of the present invention were confirmed. FIG. 7 is a current-voltage graph showing a resistive switching characteristic, and in (a) of FIG. 7, when a DC voltage was applied to a resistive switching layer of the device in the order of 0 V→2.0 V→0 V→-2.0 V→0 V, it was able to be confirmed that resistive switching in which a high resistance state switches to a low resistance state around +/-1.5 V is possible. This result shows that resistive switching occurs by a valence change mechanism in which iodide vacancy in a halide perovskite with a conventional Au upper electrode migrates. Next, (b) of FIG. 7 shows a result of endurance measurement to determine how many times the on/off switching can be repeated after a memory device is manufactured with an Au/ITO electrode. The black dots indicate low resistance states, and the red dots indicate the high resistance states.

Figure 8:
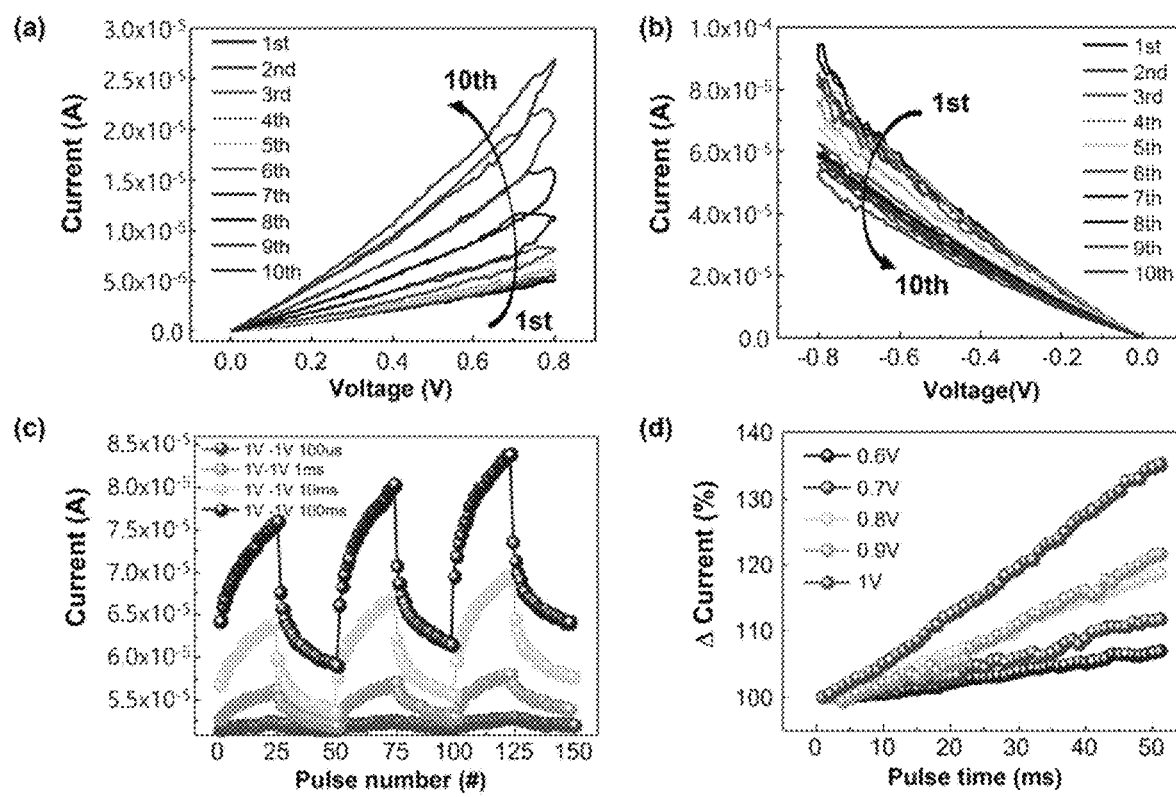
FIG. 8 shows multi-state current-voltage graphs and a result of measuring potentiation & depression by a pulse voltage for a neuromorphic device using an Au upper electrode.

In FIG. 8, (a) shows the analog switching result in which a current flow is gradually reduced when negative sweep voltages corresponding to 0V→-0.8V→0V were consecutively and repeatedly applied 10 times to a neuromorphic device manufactured with an Au upper electrode and an ITO lower electrode, and conversely, when positive sweep voltages corresponding to 0V→0.8V→0V were consecutively applied, current gradually increases. Accordingly, it can be confirmed that this device shows analog-resistive switching in which resistive switching is gradually shown by the same electrical stimulation.

In FIG. 8, (b) shows the result of confirming that resistance against potentiation electric pulses was gradually and linearly increased by 20 times of repeated applications of potentiation electric pulses of 1V 640 µs (length) to the device and immediate measurement of current at 0.05V (black dots). In addition, a depression behavior in which resistance is linearly reduced was exhibited by applying depression electric pulses of -1V 640 µs (length) to the device 20 times and measuring current likewise (red dots). The above procedures were repeated three times to demonstrate that the device exhibited reliable potentiation and depression.

Figure 9:
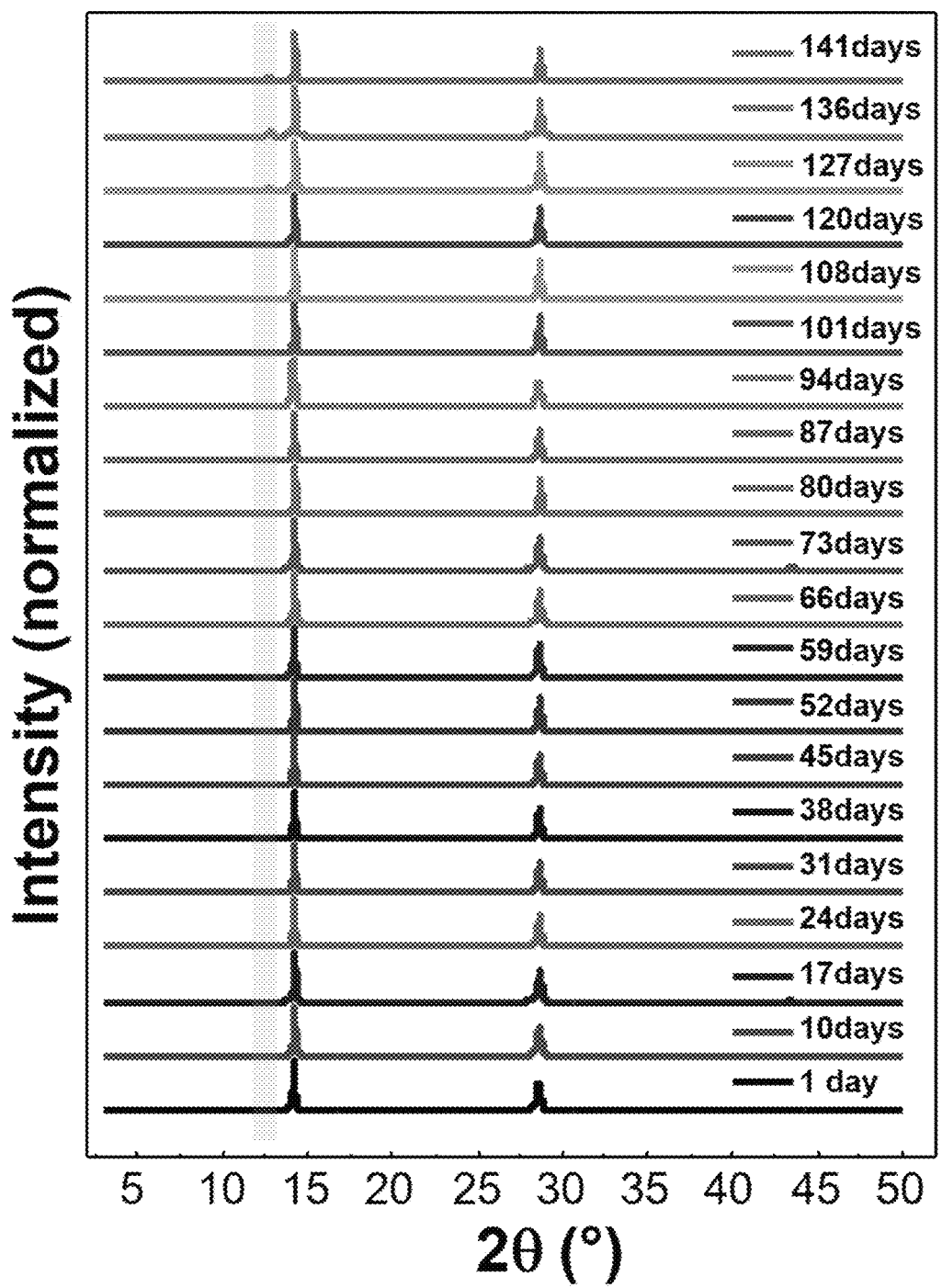
FIG. 9 shows an X-ray diffraction analysis result for a vertically-oriented halide perovskite thin film for 140 days.

FIG. 9 shows the XRD result for the manufactured device for 1 to 50 days under an ambient air condition (stored indoors at room temperature), indicating that a nanostructure layer of the thin film was maintained for 30 days. Therefore, it was confirmed that the resistive switching layer manufactured by the manufacturing method of the present invention has excellent humidity stability and endurance due to increased phase stability.

In yet another embodiment of the present invention, a composition of an organic halide perovskite memristor and a neuromorphic resistive switching layer thin film having a Dion-Jacobson phase [DJ-phase, structural formula: $(A')_1A_{n-1}B_nX_{3n+1}$] not a 2D perovskite of a Ruddlesden-Popper phase [RP-phase, structural formula: $(R-NH_3)_2 A_{n-1}B_nX_{3n+1}$] are provided.

While a quasi-2D structure was made by putting an organic material, such as butyl amine (BA) or phenethyl amine (PEA), which has a larger particle size than a material entering the A site into the ($R-NH_3$) entering the RP-phase, A' entering the DJ-phase of the present invention has a $NH_3-R'-NH_3$ structure, which is an organic compound with two ammonium groups. Due to the two ammonium structures, hydrogen bonds are formed at both sides without a van der Waals gap between $B_nX_{3n+1}$ octahedral layers, thereby obtaining a stable, symmetrical and linear neuromorphic characteristic.

Figure 10:
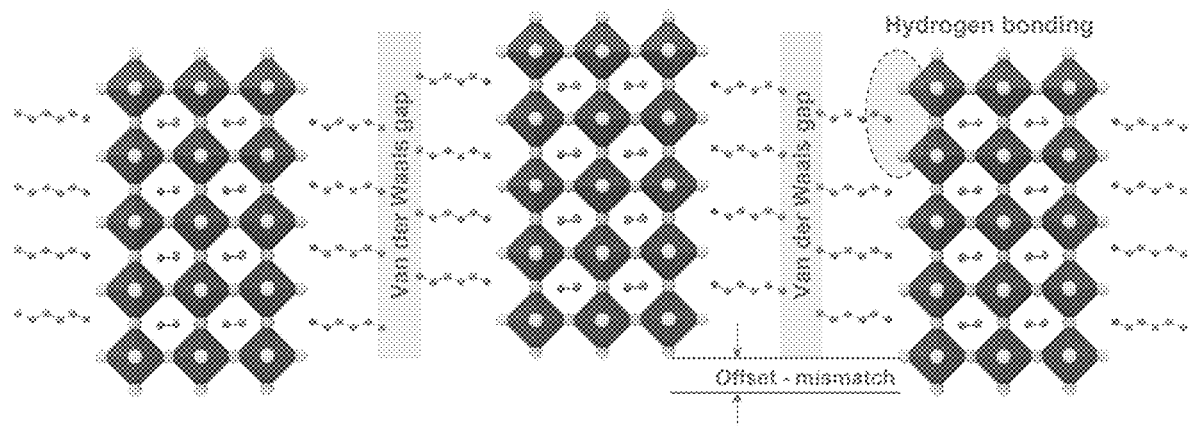
FIGS. 10 and 11 show the bonding structures in crystals in RP-phase and DJ-phase, respectively.
Figure 11:
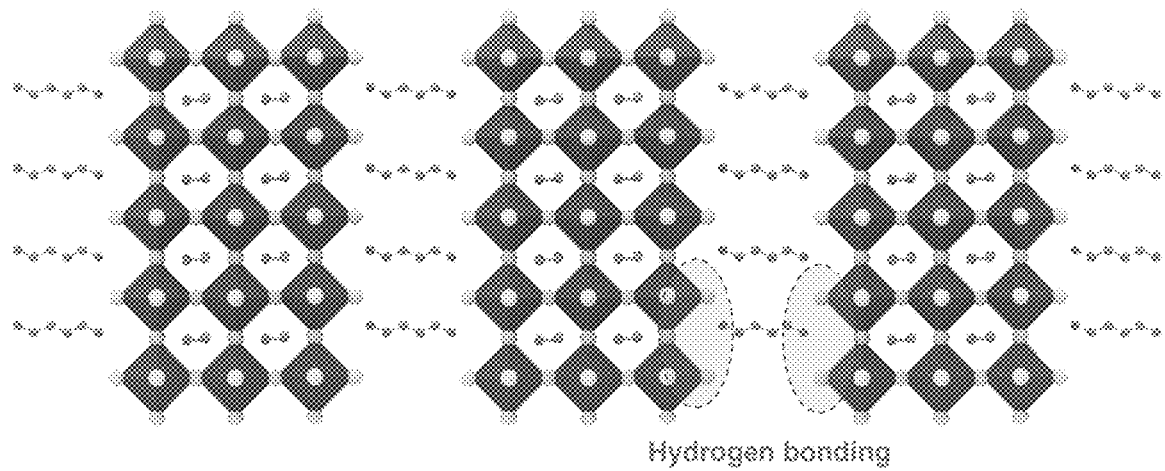

FIGS. 10 and 11 show the bonding structures in crystals in the RP-phase and DJ-phase, respectively.

Referring to FIGS. 10 and 11, in the RP-phase, amine groups indicated by green dots in the crystal form one hydrogen bond, and the others form van der Waals bonds. However, it can be seen that, in the DJ-phase, two amine groups form two hydrogen bonds with adjacent lattice layers, respectively.

Therefore, the thin film of the present invention forming hydrogen bonds at both sides without a van der Waals gap between octahedral layers is capable of implementing a neuromorphic device with a stable, symmetrical and linear neuromorphic characteristic.

Figure 12:
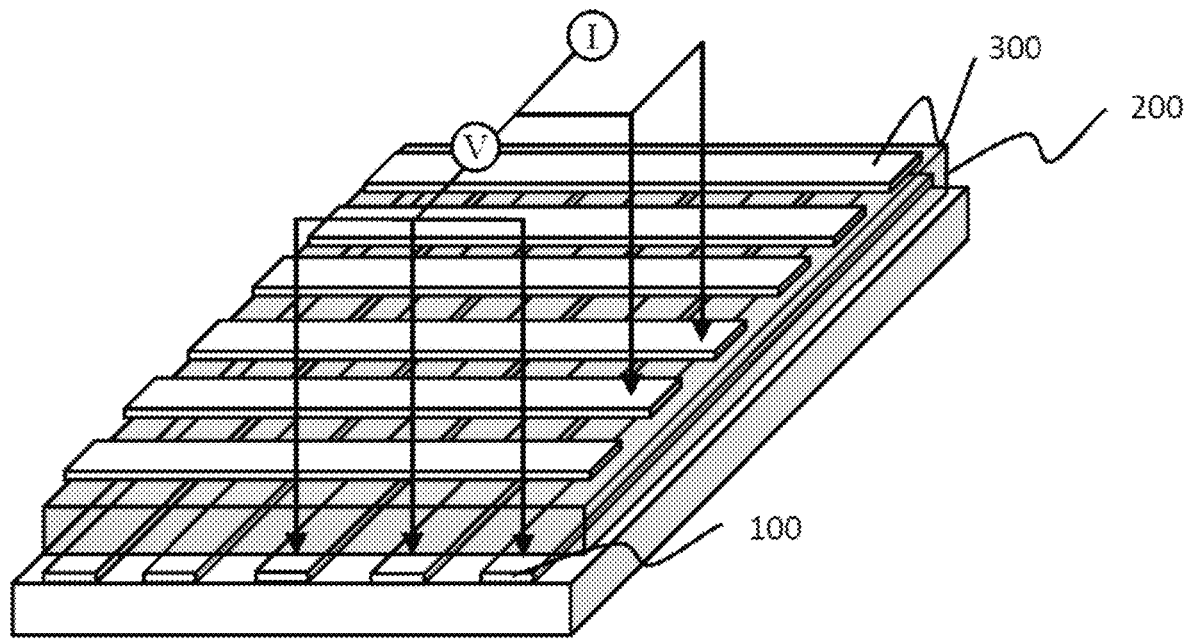
FIGS. 12 and 13 are the cross-sectional views and the entire device array of a neuromorphic memristor device according to the present invention.
Figure 13:
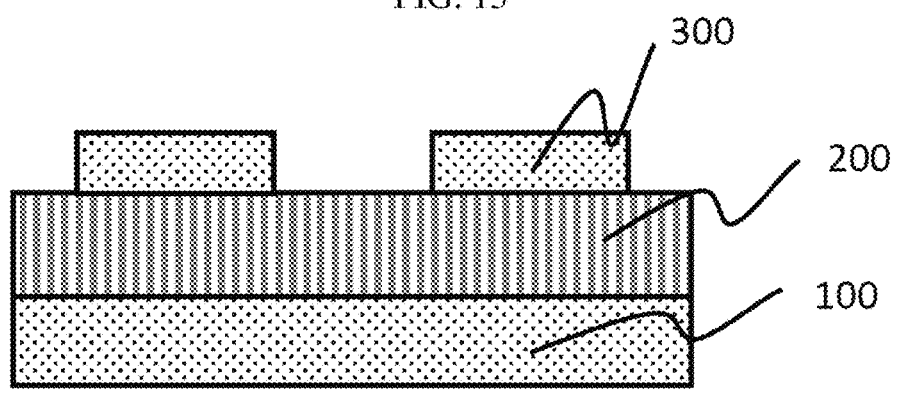

FIGS. 12 and 13 are the cross-sectional views of a neuromorphic memristor device according to the present invention and the entire device array.

Referring to FIGS. 12 and 13, the neuromorphic memristor device according to one embodiment of the present invention includes a lower electrode 100; a perovskite resistive switching layer 200 formed on the lower electrode 100; and an upper electrode 300 formed on the resistive switching layer 200, in which the resistive switching layer 200 includes an organic metal halide having a perovskite crystal structure, and the organic metal halide has a perovskite crystal structure with the above-described DJ-phase.

In one embodiment of the present invention, the organic metal halide has a structure represented by Formula 2 below.

$$(A')_1A_{n-1}B_nX_{3n+1} \quad \text{[Formula 2]}$$

wherein, A' is $NH_3-R_1-NH_3$,
A is any one selected from the group consisting of Rb, Cs, K, Mg, Ca, Sr, and Ba and an organic cation,
B is one or more metal cations selected from the group consisting of Cr, Mn, Fe, Co, Ni, Cu, Zn, Ga, In, Tl, Ge, Cd, Hf, Sn, Bi, and Pb,
$R_1$ is each independently a substituted or unsubstituted $C_{1-24}$ alkyl group or a substituted or unsubstituted $C_{1-24}$ aryl group,
X is a halide anion or chalcogenide anion, and
n is an integer of 2 or more.

Here, since A' has two amine groups, it forms two hydrogen bonds in the crystal structure, thereby inducing a stable, symmetrical and linear neuromorphic characteristic.

In addition, the above-described resistive switching layer has a vertically-oriented nanostructure, and the A' may be any one selected from the group consisting of propane-1,3-diamine (PDA), butane-1,4-diamine (BDA), pentane-1,5-diamine (PDA), hexane-1,6-diamine (HDA), heptane-1,7-diamine, octane-1,8-diamine (ODA), N1-methylethane-1,2-diammonium (N-MEDA), N1-methylpropane-1,3-diammonium (N-MPDA), 2-(dimethylamino)ethyl ammonium (DMEN), 3-(dimethylamino)-1-propyl ammonium (DMAPA), 4-(dimethylamino)butyl ammonium (DMABA), 2,20-(ethylenedioxy)bis(ethylammonium) (EDBE), 3-(aminomethyl)piperidinium (3AMP), 4-(aminomethyl)piperidinium (4AMP), and 1,4-phenylene dimethaneammonium (PDMA).

In one embodiment of the present invention, the metal cation A may be one or more selected from the group consisting of Rb, Cs, K, Mg, Ca, Sr and Ba and an organic cation, but the present invention is not limited thereto. The organic cation may be methylammonium (CHgNHg', MA) or formamidinium (NH CHNH, FA).

In another embodiment of the present invention, in the B site, one metal cation selected from the group consisting of Cr, Mn, Fe, Co, Ni, Cu, Zn, Ga, In, Tl, Ge, Cd, Hf, Sn, Bi and Pb is included, and in the X site, a halide anion or a chalcogenide anion is included. In the present invention, a halide perovskite thin film is manufactured by coating with a solution containing the above-mentioned materials.

The X may be an anion of a halide such as F, Cl, Br or I, or an anion of a chalcogenide such as S or Se, but the present invention is not limited thereto. In the solution, an additive having an anion with a similar size to a halide ion entering the X site may be added, thereby synthesizing a halide perovskite thin film having a vertically-oriented nanostructure.

The anionic additive includes a pseudohalide anion. The anionic additive includes a cyanide, isocyanide, cyanate or thiocyanate anion, and may be, for example, ammonium thiocyanate ($NH_4SCN$) or lead thiocyanate ($Pb(SCN)_2$), but the present invention is not limited thereto.

In addition, the memristor device according to the present invention is manufactured by the same method as shown in FIG. 2, and as described above, the resistive switching layer of the present invention has a vertically-oriented nanostructure. The device uses a resistive switching layer having a perovskite crystal structure having a Dion-Jackson phase, represented by Formula 2, and the resistive switching layer has a vertically-oriented structure.

Hereinafter, the present invention will be described in further detail with reference to examples below.

Example 2

Manufacturing of Halide Perovskite Resistive Switching Device Having Vertically-Oriented Nanostructure A lower electrode in which ITO was deposited on glass was prepared. A BDA 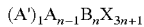 precursor solution was prepared by dissolving butanediamine iodide (BDAI) powder, methylamine iodide (MAI) powder and $PbI_2$ powder in a DMAc, DMF or DMSO solvent, and for vertical orientation, pseudohalide powder ($NH_4SCN$) was added. Particularly, in the present invention, to improve the characteristics of a neuromorphic device, a perovskite thin film having a vertically-oriented crystal phase was manufactured using a pseudohalide ($NH_4SCN$) was manufactured.

Subsequently, a resistive switching layer was formed by spin-coating the lower electrode with the precursor solution and thermally treating the resulting electrode at 100° C. The resistive switching layer was formed by spin-coating the surface of the lower electrode with the above solution. After the resistive switching layer was formed, an Au upper electrode was deposited under vacuum, thereby manufacturing a neuromorphic memristor device.

Experimental Example 3

Analysis Result of Halide Perovskite Thin Film Having Vertically-Oriented Nanostructure In Experimental Example 3, an X-ray diffraction (XRD) graph of a neuromorphic device shows the result measured using Bruker D8-Advance. The surface of a thin film and the cross-section of the device are identified by SEM, and the imaging device was MERLIN Compact (FE-SEM). In addition, to confirm the resistive switching characteristic, a current-voltage graph was plotted with resistive switching data measured using MS-Tech Probe Station.

Figure 14:
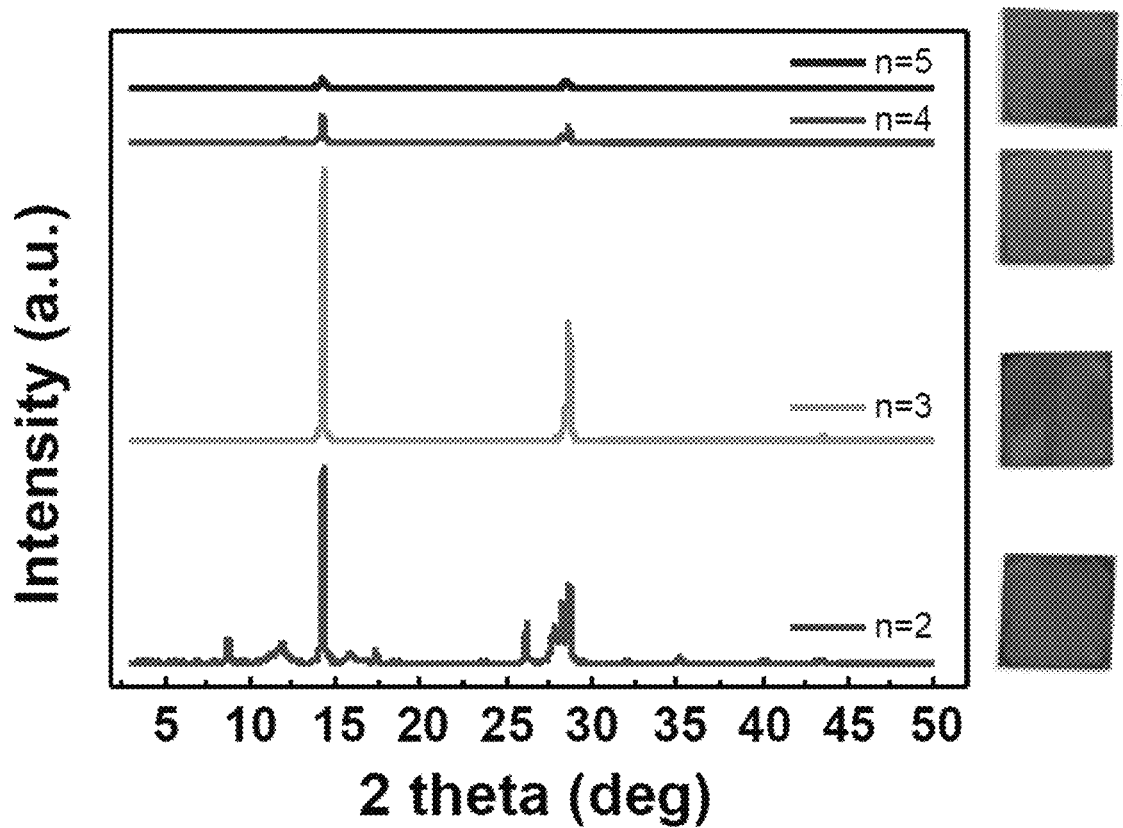
FIG. 14 is the XRD analysis result confirming the cross-section and surface of a resistive switching layer of a halide perovskite with a nanostructure, manufactured in Example 2.

The result of confirming the cross-section and surface of the halide perovskite resistive switching layer having a nanostructure, formed in Example 2, is shown in FIG. 14.

As shown in FIG. 14, in the composition ratio of the resistive switching layer of BDA $MA_{n-1}Pb_nI_{3n+1}$, an additive was added to confirm synthesis of a thin film with the most dominant vertical peak. That is, when n=2 and n=3, it can be seen that family peaks indicating growth in a vertical direction are clearly shown near (1,0,−1)=14 degrees, (2,0,−2)=28 degrees and (3.0,−3)=43 degrees, and have high intensity. This shows that the vertical orientation characteristic can be freely controlled according to a composition ratio in the present invention.

Figure 15:
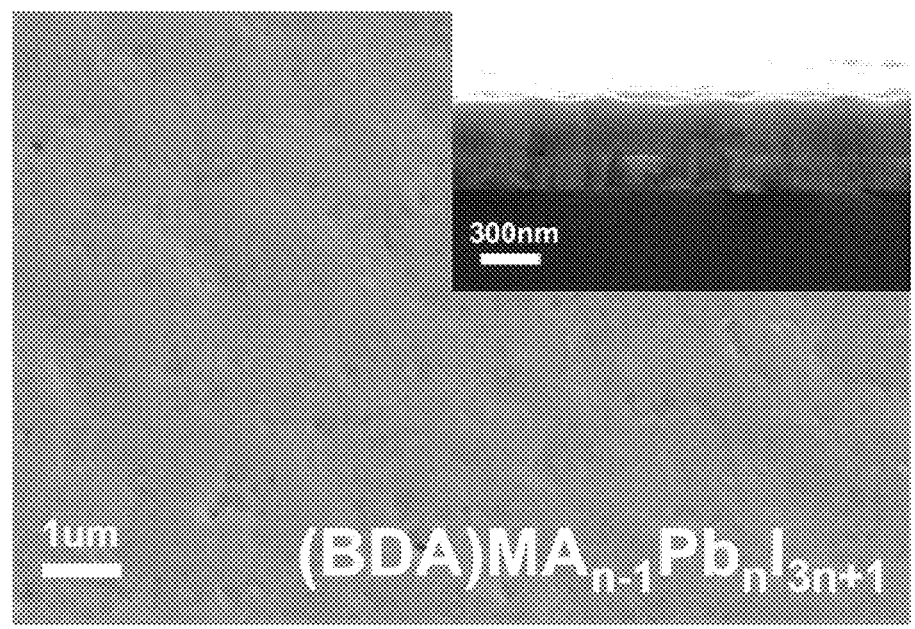
FIG. 15 is the SEM image of a resistive switching layer of a halide perovskite with a nanostructure, manufactured in Example 2, when n=3.

FIG. 15 is an SEM image when n=3. That is, the cross-section when n=3, showing the most pronounced vertical orientation characteristic, can be shown in FIG. 15.

Experimental Example 4

Confirmation of Resistive Switching Characteristic and Neuromorphic Characteristic for Halide Perovskite Material Having Vertically-Oriented Nanostructure In Experimental Example 4, the resistive switching and neuromorphic characteristics of the device according to the present invention were confirmed.

Figure 16:
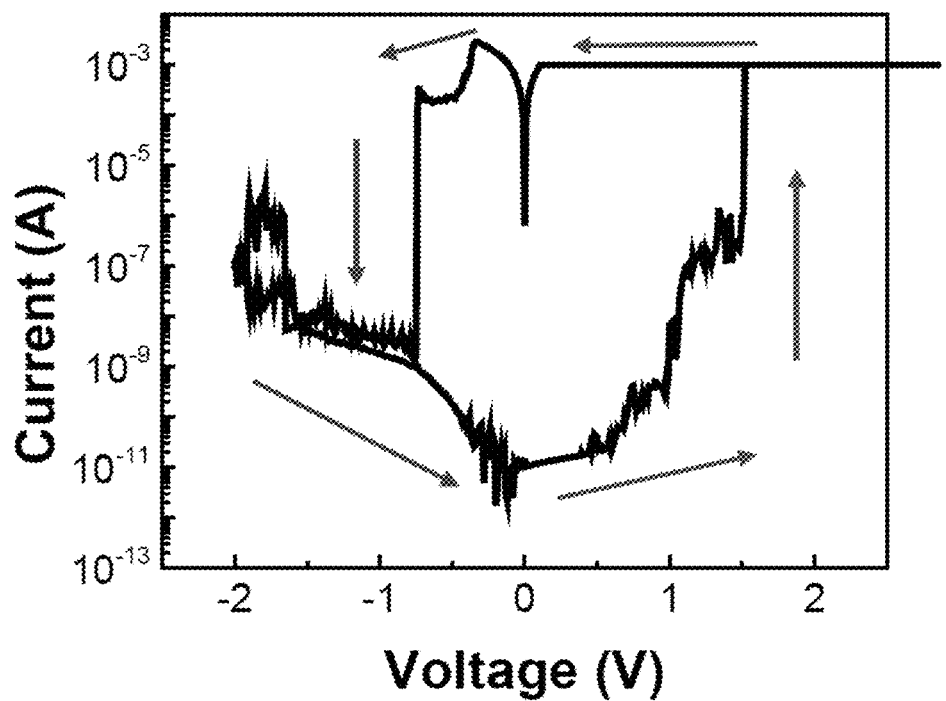
FIG. 16 is the current-voltage graph which confirms a resistive switching characteristic for a memristor device using an Au upper electrode.

FIG. 16 is a current-voltage graph confirming a resistive switching characteristic for a memristor device using an Au upper electrode. Referring to FIG. 16, when a DC voltage was applied to the resistive switching layer of the device in the order of 0 V→2.0 V→0 V→−2.0 V→0 V, it can be confirmed that the previous high resistance state (HRS, low current state) of the device is switched to a low resistance state (LRS), high current state), and the LRS is switched back to the HRS in the opposite voltage direction.

This result shows that resistive switching occurs by a valence change mechanism in which iodide vacancy in a halide perovskite having a conventional Au upper electrode migrates.

Figure 17:
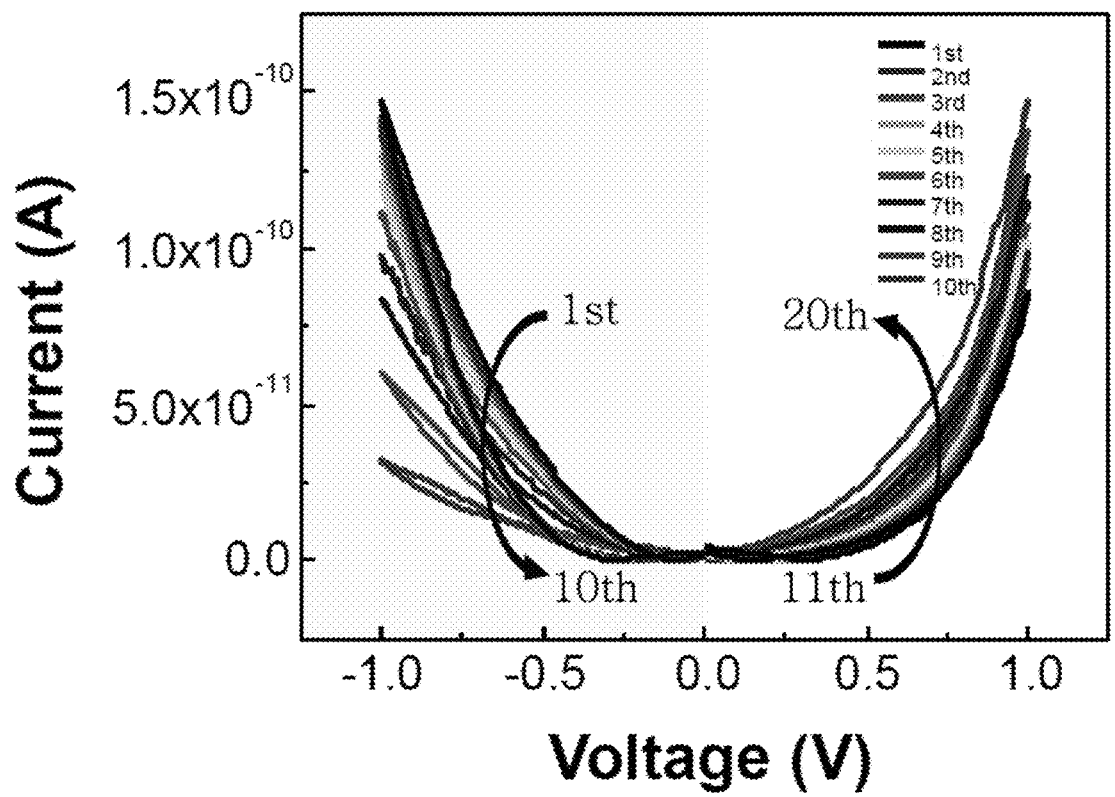
FIG. 17 is the multi-state current-voltage graph for a neuromorphic device using an Au upper electrode.

FIG. 17 is the multi-state current-voltage graph for a neuromorphic device using an Au upper electrode.

Referring to FIG. 17, it can be confirmed that as a result of 10 repeated I-V sweeps in a range, in which switching does not occur, of 0 V→+1 V→0 V, a behavior of gradually reducing resistance is shown, and conversely, it can be confirmed that, by I-V sweeps of 0 V→−1 V→0 V, a behavior of gradually reducing resistance is shown (analog switching characteristic).

Figure 18:
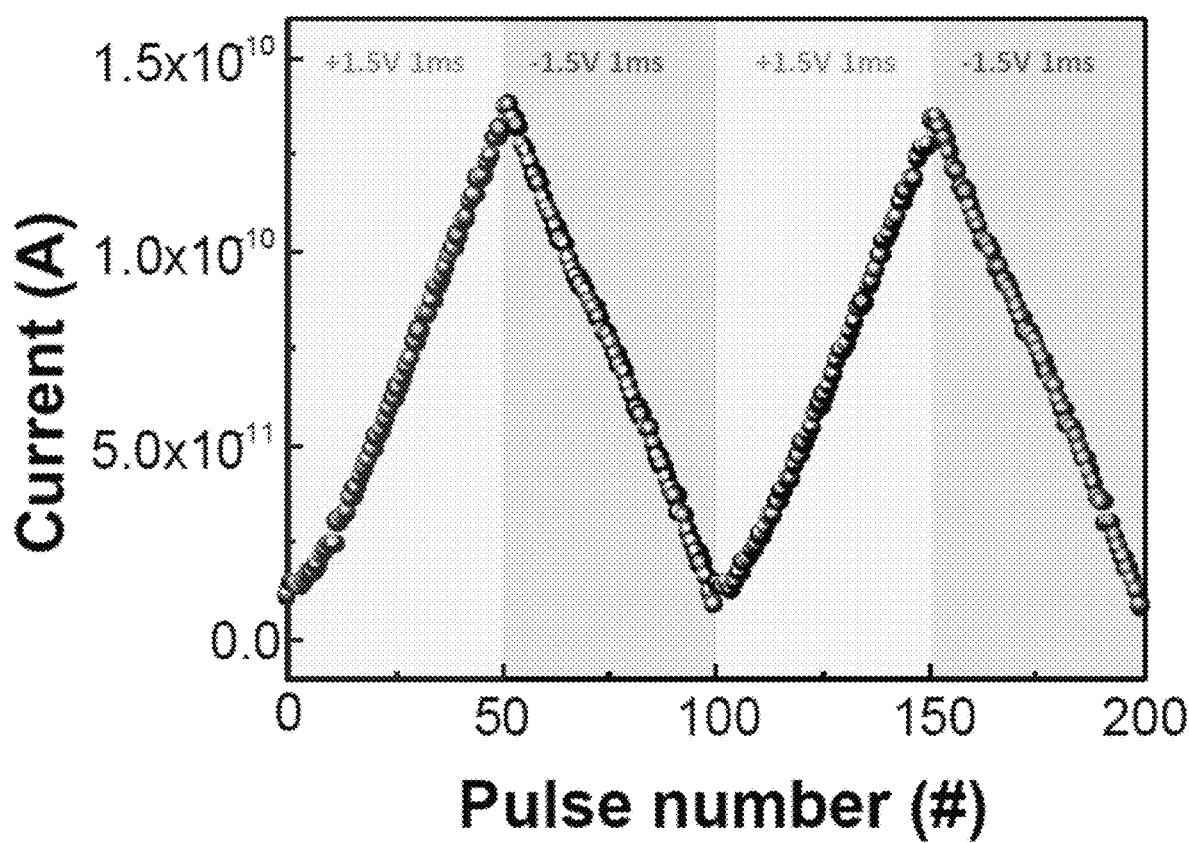
FIG. 18 shows the results of measuring potentiation & depression by a pulse voltage for a neuromorphic device using an Au upper electrode.

FIG. 18 shows the results of measuring potentiation & depression by a pulse voltage for a neuromorphic device using an Au upper electrode.

Referring to FIG. 18, in the program that gives a pulse and reads current at 0.05V, when a +1.5V pulse (1 ms) was applied 50 times, resistance was gradually reduced (an increase in synaptic weight—potentiation), whereas when a −1.5V pulse (1 ms) was applied 50 times, resistance was gradually increased (a decrease in synaptic weight—depression). Although this procedure was repeated, the same characteristic as described above was shown, which means that the present invention can control resistive switching with more symmetry and linearity than the previously reported memristor device. Therefore, the memristor device according to the present invention has an excellent neuromorphic characteristic.

A neuromorphic memristor device of the present invention includes a resistive switching layer having a perovskite crystal using a solution containing an organic metal halide. According to a method of manufacturing a device according to the present invention, a channel that can be used to form a filament is formed in advance when the vertically-oriented nanostructure of a resistive switching layer is formed, so the vertically-oriented nanostructure has advantages of easier filament control and easier channel formation than a conventional random polycrystalline thin film. In addition, as the phase stability of the halide perovskite thin film is increased, the thin film is maintained in a humid atmosphere without decomposition, so humidity stability and endurance can be effectively improved.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A neuromorphic memristor device, comprising:
a resistive switching layer formed on a lower electrode, the resistive switching layer comprises an organic metal halide having a perovskite crystal structure; and
an upper electrode formed on the resistive switching layer,
wherein the perovskite crystal structure has a Dion-Jacobson phase,
wherein the organic metal halide is represented by Formula 2 below:

$$(A')_1A_{n-1}B_nX_{3n+1} \quad \text{[Formula 2]}$$

wherein, A' is $NH_3-R_1-NH_3$,
A is any one selected from the group consisting of Rb, Cs, K, Mg, Ca, Sr, and Ba and an organic cation,
B is one or more metal cations selected from the group consisting of Cr, Mn, Fe, Co, Ni, Cu, Zn, Ga, In, Tl, Ge, Cd, Hf, Sn, Bi, and Pb,
$R_1$ is each independently a substituted or unsubstituted $C_{1-24}$ alkyl group or a substituted or unsubstituted $C_{1-24}$ aryl group,
X is a halide anion or chalcogenide anion, and
n is an integer of 2 or more.

2. The device of claim 1, wherein the A' forms two hydrogen bonds in the crystal structure.

3. The device of claim 1, wherein the resistive switching layer has a vertically-oriented nanostructure.

4. The device of claim 2, wherein the resistive switching layer has a vertically-oriented nanostructure.

5. The device of claim 1, wherein the A' is any one selected from the group consisting of propane-1,3-diamine (PDA), butane-1,4-diamine (BDA), pentane-1,5-diamine (PDA), hexane-1,6-diamine (HDA), heptane-1,7-diamine, octane-1,8-diamine (ODA), N1-methylethane-1,2-diammonium (N-MEDA), N1-methylpropane-1,3-diammonium (N-MPDA), 2-(dimethylamino)ethyl ammonium (DMEN), 3-(dimethylamino)-1-propyl ammonium (DMAPA), 4-(dimethylamino)butyl ammonium (DMABA), 2,20-(ethylenedioxy)bis(ethylammonium) (EDBE), 3-(aminomethyl)piperidinium (3AMP), 4-(aminomethyl)piperidinium (4AMP), and 1,4-phenylene dimethaneammonium (PDMA).

6. A neuromorphic memristor device, comprising:
an electrode manufactured by depositing an indium-tin oxide (ITO) or fluorine-doped tin oxide (FTO); and
a resistive switching layer formed on the electrode, the resistive switching layer comprises an organic metal halide having a perovskite crystal structure,
wherein the perovskite crystal structure has a Dion-Jacobson phase,
wherein the organic metal halide is represented by Formula 2 below:

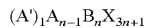   [Formula 2]

wherein, A' is $NH_3-R_1-NH_3$,

A is any one selected from the group consisting of Rb, Cs, K, Mg, Ca, Sr, and Ba and an organic cation, B is one or more metal cations selected from the group consisting of Cr, Mn, Fe, Co, Ni, Cu, Zn, Ga, In, Tl, Ge, Cd, Hf, Sn, Bi, and Pb, $R_1$ is each independently a substituted or unsubstituted $C_{1-24}$ alkyl group or a substituted or unsubstituted $C_{1-24}$ aryl group, X is a halide anion or chalcogenide anion, and n is an integer of 2 or more.

7. The device of claim 6, wherein the resistive switching layer has a vertically-oriented nanostructure.

8. The device of claim 6, wherein the A' forms two hydrogen bonds in the crystal structure.

9. The device of claim 6, wherein the A' is any one selected from the group consisting of propane-1,3-diamine (PDA), butane-1,4-diamine (BDA), pentane-1,5-diamine (PDA), hexane-1,6-diamine (HDA), heptane-1,7-diamine, octane-1,8-diamine (ODA), N1-methylethane-1,2-diammonium (N-MEDA), N1-methylpropane-1,3-diammonium (N-MPDA), 2-(dimethylamino)ethyl ammonium (DMEN), 3-(dimethylamino)-1-propyl ammonium (DMAPA), 4-(dimethylamino)butyl ammonium (DMABA), 2,20-(ethylenedioxy)bis(ethylammonium) (EDBE), 3-(aminomethyl)piperidinium (3AMP), 4-(aminomethyl)piperidinium (4AMP), and 1,4-phenylene dimethaneammonium (PDMA).

* * * * *